United States Patent [19]

Marcquart et al.

[11] Patent Number: 5,518,594
[45] Date of Patent: May 21, 1996

[54] PANE WITH TRANSMISSION PROPERTIES THAT VARY WITH THE ANGLE OF INCIDENCE

[75] Inventors: Philippe Marcquart, Asnières; Claude Bernard, Annet S/Marne, both of France

[73] Assignee: Saint Gobain Vitrage International, Courbevoie, France

[21] Appl. No.: 153,909

[22] Filed: Nov. 17, 1993

[30] Foreign Application Priority Data

Nov. 17, 1992 [FR] France ................... 92 13769

[51] Int. Cl.⁶ ................... C23C 14/34; C23C 14/56
[52] U.S. Cl. ................ 204/192.26; 204/192.12; 204/192.15; 204/298.11
[58] Field of Search ............ 204/192.11, 192.12, 204/192.15, 192.26, 192.27, 192.28, 298.11, 298.18, 298.19, 298.06

[56] References Cited

U.S. PATENT DOCUMENTS

| 4,006,073 | 2/1977 | Welch | 204/298.06 |
| 4,472,259 | 9/1984 | Class et al. | 204/192.12 |
| 4,497,700 | 2/1985 | Groth et al. | 204/192.27 |
| 5,080,774 | 1/1992 | Heitzer | 204/298.11 |
| 5,114,556 | 5/1992 | Lamont, Jr. | 204/192.12 |
| 5,242,560 | 9/1993 | Lingle et al. | 204/192.26 |

FOREIGN PATENT DOCUMENTS

| 0438357 | 7/1991 | European Pat. Off. | |
| 2348165 | 11/1977 | France. | |
| 265175 | 2/1989 | Germany | 204/192.26 |

OTHER PUBLICATIONS

Journal of Applied Physics, vol. 67, No. 2, pp. 1030–1036, Jan. 15, 1990, Y. Gotoh, et al., "Structures and Properties of Chromium Thin Films Prepared by Anisotropic-Emission--Effect Sputter Deposition".

*Primary Examiner*—R. Bruce Breneman
*Assistant Examiner*—Rodney G. Mc Donald
*Attorney, Agent, or Firm*—Oblon, Spivak, McClelland, Maier & Neustadt

[57] ABSTRACT

This invention concerns a pane having a film, the light transmission of which varies as a function of the direction of the incident light. The deposition technique is cathodic sputtering. It uses, between the cathode 1 and the substrate 4, a guide 6 which channels the particles.

10 Claims, 3 Drawing Sheets

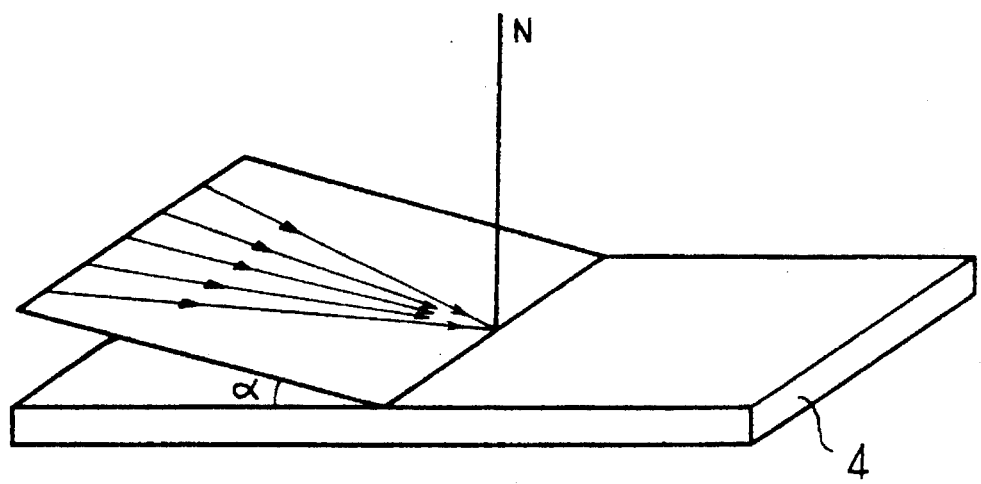
FIG.2
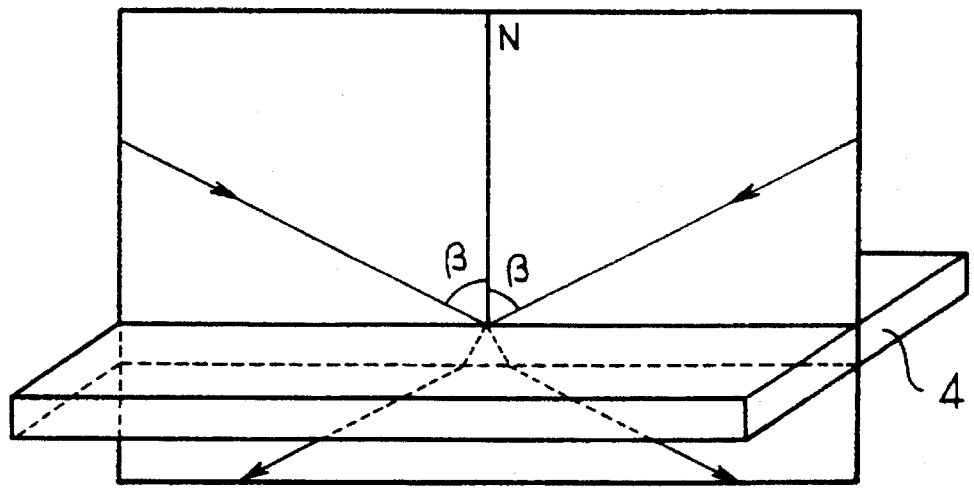

PANE WITH TRANSMISSION PROPERTIES THAT VARY WITH THE ANGLE OF INCIDENCE

The entire contents of FR 92 13769 are hereby incorporated by reference.

BACKGROUND OF THE INVENTION

1. Field of the Invention

This invention concerns panes, especially panes covered with thin films produced by vacuum techniques, such as cathodic sputtering, and optical properties which vary as a function of the angle of incidence of the light.

2. Discussion of the Background

In many cases it would be desirable to have panes, the optical and energy properties of which vary as a function of the direction of illumination or observation. Conventionally, such an effect is achieved by shutters or Venetian blinds, but there are aesthetic or practical limits to these systems. In particular, they are not at all well adapted to automobiles.

However, it is particularly in modern automobiles that the need for such systems is increasingly becoming felt. The glazed parts are becoming ever larger in area and are more and more steeply inclined and therefore, offer very large areas for solar intake, especially in summer when the sun is high. This leads to overheating of the passenger space. The usual procedures for reducing the transmission, by increasing the reflection or the absorption of the panes unfortunately reach their limits very rapidly, because of the regulations which impose minimum values for the light transmission for the panes of an automobile, of whatever kind they may be. It therefore appears particularly advantageous to be able to have available a pane which assures the driver of an automobile, the required light transmission, but will allow the reduced transmission-especially the energy transmission—in other directions.

The need for a variable transmission pane is, however, not limited to automobiles, but in building construction as well. In residential buildings and offices, it is desired to provide protection against sunshine, but nevertheless to maintain the maximum contact with the outside world. Likewise, a need exists for functional panes which favor natural lighting, in particular in professional and business premises, especially in offices of the "landscaped" type, that is to say in office blocks of great depth. It is then desired to increase the illumination at the back of the rooms but to maintain a supportable level in the region of the windows. It is therefore a matter of combatting the natural decrease in illumination with distance from the glazed wall.

In the past, special case glasses with a prismatic structure have been developed for fulfilling this function, but apart from the fact that they interfere with a clear view of the external environment, they become dirty because their very pronounced relief surface traps dust. Moreover, the rolling techniques which enable them to be produced are difficult when it is desired to achieve a precise optical effect.

The invention therefore has the objective of providing a pane, the light and energy transmission of which varies as a function of the angle of incidence of the light. It is also necessary that such a pane can be produced industrially, that is to say particularly in dimensions compatible with use in applications such as automobile production or building with a satisfactory quality, that is in particular an identity of performance between different points of the pane.

A holographic technique has been proposed for supplying automobile panes which possess, for the driver, the required light transmission but which have a strong reflection for solar radiation when it meets the pane at a different angle of incidence. In particular, German Patent Applications DE 31,36946 and DE 38,22814 propose methods for the production of a holographic film to be integrated into an automobile pane. These techniques, though attractive from the theoretical standpoint and enabling the production of satisfactory prototypes, are not yet sufficiently developed to arrive at economical products which could become widespread in use.

In the laboratory, furthermore, means are known for creating transparent substrates, such as glass, with thin films deposited thereof having a "columnar" structure with a direction of the axis of the columns different from the perpendicular to the surface. These structures, are achieved over small areas most commonly of the order of one square centimeter, use vacuum deposition techniques.

Thus, in the article "*Angular selective window coatings: theory and experiment*" by MBISE, SMITH, NIKLASSON and GRANQVIST, SPIE vol. 1149, Optical materials technology for energy efficiency and solar energy conversion VIII (1989) pp 179–199, a method of thermal evaporation of silver and chromium is proposed, the evaporation source (the metal placed in a crucible) being punctiform and the different incidences all obtained on the same substrate situated 30 cm from the source. The specimens obtained possess, at the positions corresponding to a given oblique direction of deposition (for example 80°), a light transmission that varies according to the direction of the incident light. Such a thermal evaporation technique, with one or more punctiform sources, cannot be used industrially for the production of columnar films, because with respect to each point of the specimen, there corresponds a different deposition direction and therefore not only a different perpendicular light transmission but also a different law of dependence upon the angle of incidence.

J. W. PATTEN in "*The influences of surface topography and angle of adatom incidence on growth structure in sputtered chromium*", Thin Solid Films, 63 (1979) pp 121–129, describes a cathodic sputtering technique in which a diaphragm (diameter 2.5 cm) is placed in front of the target. The substrate has facets orientated at six different angles from 0° to 99°, which makes possible the obtaining of specimens of films having an area of at most 1 cm². The measurements performed on the columnar films are not of an optical nature.

Thus the techniques of the prior art, if they enable the basic phenomena to be studied, did not provide any solution to the problem of the industrial production of columnar films.

Also known are means for stopping down the cathodic sputtering cathodes by placing, in front of the targets, masks of perforated plate, made either of expanded metal or of metal cloths, but their purpose is to obtain films of variable thicknesses, the variation of the ratio between the holes and the solid parts of the screens enabling the thickness of the films obtained in defined conditions to be varied.

Other techniques have been proposed for selecting, from among the particles emitted by the target with which the cathode of a sputtering apparatus is equipped, those that are emitted substantially perpendicularly to the surface of the target. Thus the Patent DD 285,897 proposes to place, before the target, a series of mutually parallel blades perpendicular to its surface (and to the axis of the cathode). The objective is positively to control the thickness of the deposits on objects of round shape.

SUMMARY OF THE INVENTION

The present invention concerns a pane made of the transparent substrate, comprising a metal-based film with the axes of growth of the film parallel to the straight lines contained in a dihedron of narrow opening. Preferably, the opening of the dihedron, $2\Delta\alpha$, is less than 15°. Similarly, the bisector plane of the dihedron, makes an acute angle $\alpha$ with the substrate, of preferably less than 40°.

In a variant of the invention, the film is made of an absorbent material and the transmission of radiation varies as a function of the direction of incidence.

The present invention also provides for a laminated panel comprising a transparent substrate with a metal-based film, an intermediate poly vinylbutyryl layer and a second transparent substrate.

According to the invention also, is a method for depositing anisotropic thin films by cathodic sputtering of a target onto a substrate, wherein the particles emitted by the target are channelled by a guide and are directed obliquely onto the plane of the substrate, their impact directions on the substrate are parallel to straight lines contained in a dihedron of narrow opening, the opening of which $2\Delta\alpha$ is less than 15°, and of which the bisector plane makes with the plane of the substrate an angle $\alpha$ less than 40°.

Preferably, the sputtering cathode is a planar magnetron, the axis of which is substantially parallel to the plane of the substrate which, itself, moves in its own plane.

When the substrate is a curved pane, it remains fixed relative to a plane termed plane of the substrate.

The target used is preferably either of a nickel-chromium alloy, of chromium, or of tantalum, and the sputtering is carried out in an inert gas such as argon or xenon atmosphere.

In a variant, after the deposition of chromium or tantalum, the sputtering is terminated by the addition of oxygen to the inert atmosphere.

The invention also concerns a device for channelling the particles emitted by the target of elongate form, of a cathodic sputtering cathode onto a substrate travelling relative to it and using mutually parallel plane deflectors, linked to the cathode, the deflectors being associated to form a guide and being parallel to the axis of the cathode.

With advantage, the deflectors make with the plane of the substrate, an angle less than 40° and the geometry of the cathode, in particular the position of the magnets in the case of a planar magnetron, the geometry and the position of the deflectors and that of the substrate, are such that the directions of impact of the particles remain parallel to straight lines contained with a dihedron of aperture $2\Delta\alpha$ less than 15°.

The technique of the invention thus enables films having a high angular selectivity to be industrially produced. The means of production are conventional and easy to operate. The products obtained are of the same nature as products that are well-proven in industry, in particular in the automobile industry, and they benefit simply in addition from the property of optical selectivity.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 shows the incidence of the particles and the incidence of the light rays for evaluating the film on the specimen.

DETAILED DESCRIPTION OF THE PREFERRED EMBODIMENTS

The technique used is non-reactive or reactive cathodic sputtering and are conventionally known to those of ordinary skill in the art. Preferably, cathodes with a "magnetron" are used, which enable the sputtering rate to be increased. The materials that may be used for forming the thin films with angular selection are generally speaking all the absorbent materials, in particular the metals.

Figure 1:
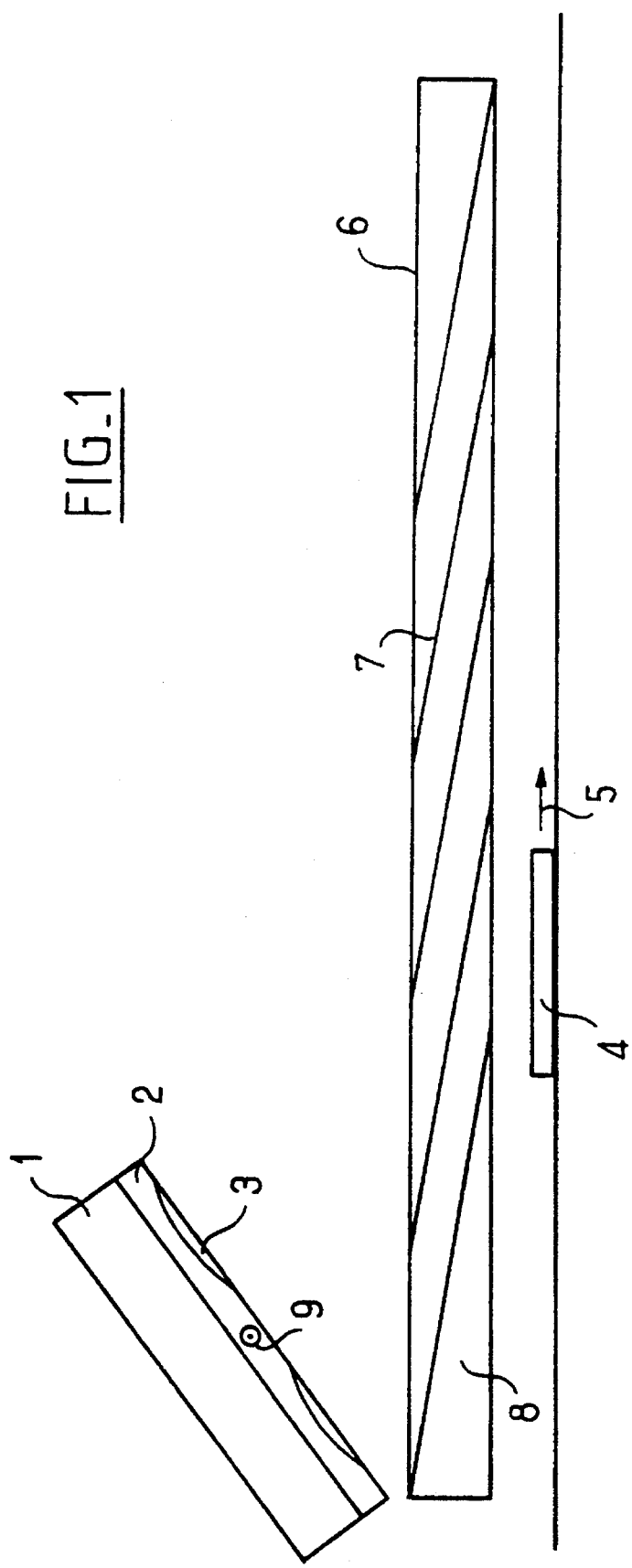
FIG. 1 shows a schematic view of the deposition apparatus.

FIG. 1 shows a horizontal section through the test apparatus. This uses a conventional cathodic sputtering apparatus using a magnetron, of the type of that is described in U.S. Pat. No. 4,166,018. This magnetron 1 is situated vertically in a vacuum enclosure, not illustrated in the figure, in other words the longitudinal axis of symmetry 9 of the "race track" target is vertical. Gases such as argon or reactive gases can be introduced. The magnetron cathode 1 is equipped with a target 2, preferably a metallic target. In the figure, zones of maximum erosion of the target 2 can be seen at 3, where the sputtering is essentially performed, and between these zones is the axis 9. The apparatus is equipped with a specimen support, not illustrated, which allows a horizontal displacement of the vertical specimen 4 in its plane in the direction of the arrow 5.

Parallel to the specimen 4, between it and the cathode 1, a guide 6 has been placed. This guide is formed of an assembly of mutually parallel vertical plane plates 7, these plates 7 being connected together by a housing or frame 8, which enables the whole assembly to be fixed. The plates 7 are spaced apart by 10 mm. The material of the guide 6 is advantageously stainless steel. The assembly is fixed with respect to the cathode 1 and is substantially parallel to the plane specimen 4 at approximately 10 mm from it.

The experimental device enabled the particles emitted by the target to strike the specimen with trajectories lying in planes which make, with the surface of the specimen, an angle $\alpha$ of between 5° and 20°.

Figure 3:
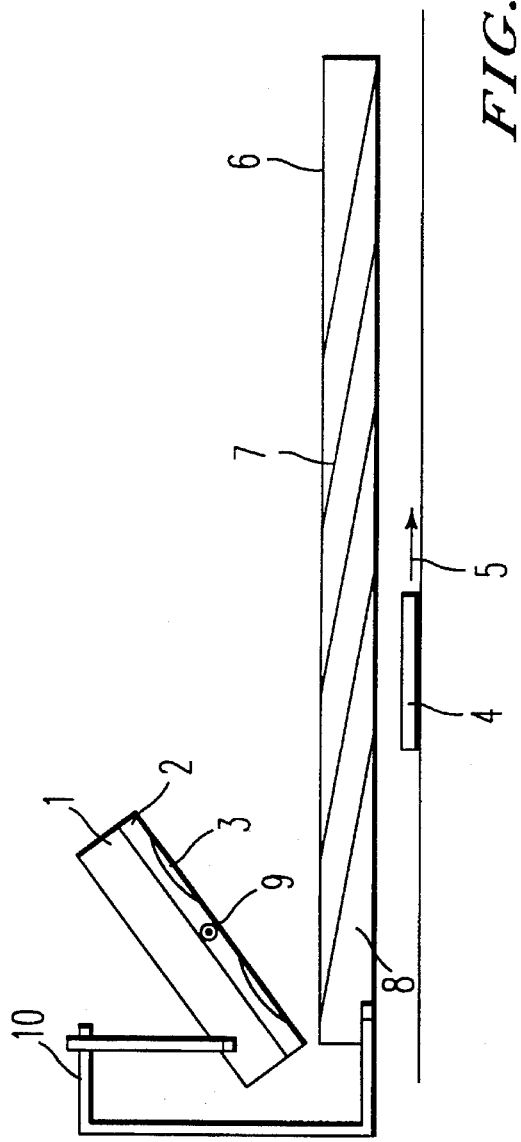
FIG. 3 shows schematically the structure 10 for linking the magnetron and its target to the guide 6.

FIG. 3 shows schematically the structure 10 for linking the magnetron and its target to the guide 6.

Figure 4:
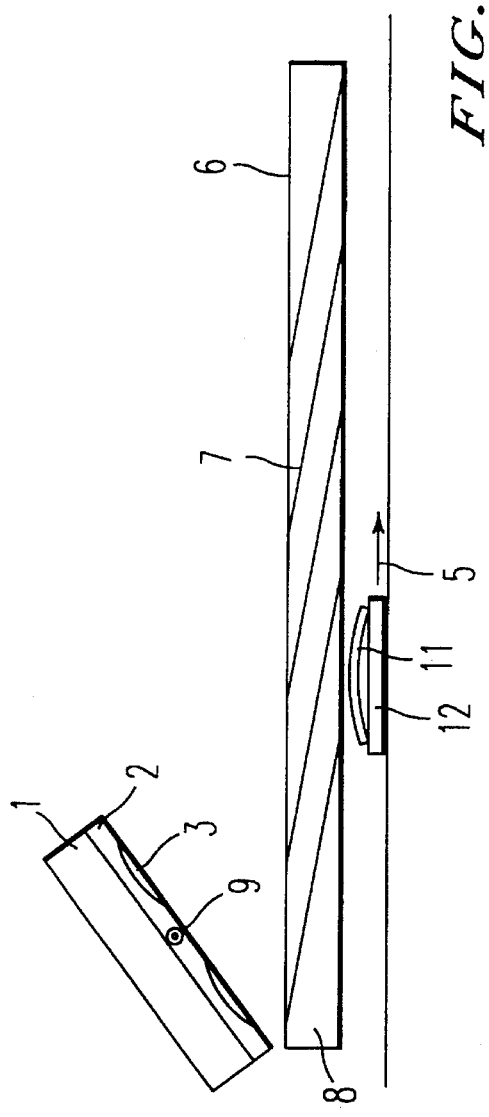
FIG. 4 shows a curved pane 11 placed upon a plane support 12.

FIG. 4 shows a curved pane 11 placed upon a plane support 4.

FIG. 2 shows, on the one hand, how the particles arrive at a point M with grazing incidences, in planes which make, with the surface of the specimen in the tests, angles $\alpha$ such that:

$$5° < \alpha < 20°$$

and, on the other hand, this same FIG. 2 shows in its lower part how the evaluation of the film is carried out at this same point M, by comparing the transmission under an incidence of +β or −β with respect to the perpendicular MN.

The light transmission measurements are made, wavelength by wavelength, and then they are integrated to give the light transmission $T_L$ (illuminant C) and possibly also the solar energy transmission $T_E$.

The present invention allows for the production of transparent substrates with a metal-based film of dimensions considerably greater than that previously achieved in the prior art. By the present process panes of 2 cm² or greater, preferrably 4 cm² or greater, more preferrably 8 cm² or greater can be obtained. This allows for the formation of transparent substrates for applications in automobiles, and commercial and residential windows.

Having generally described this invention, a further understanding can be obtained by reference to certain specific examples which are provided herein for purposes of illustration only and are not intended to be limiting unless otherwise specified.

EXAMPLE 1

The target of the magnetron is made of a nickel-chromium alloy (47–53) and has dimensions 200×100 mm². The pressure in the enclosure was 0.3 Pa, the gas being an argon-oxygen mixture with respective flow rates of 100 and 2 cm³/min. (standard conditions of temperature and pressure, NTP). The voltage established between the cathode and the enclosure was 450 volts and the current became established at 1 ampere. The total duration of the sputtering, which was carried out with several to and fro passes of the specimen 4 of clear float glass of thickness 4 mm beneath the guide 8, was 1,100 seconds.

The film, grey in appearance, was measured optically under the incidence β of +60° and −60°, and the following values of $T_L$ were obtained:

$T_L$=19.1% and $T_L$=21.3% or a relative difference of more than 10%.

EXAMPLE 2

This time, the target is the same as in Example 1, but the gas is pure argon (flow rate 100 cm³/min.) and the pressure in the enclosure is raised to 0.5 Pa. The applied voltage is 500 volts and the current intensity is established at 0.5 A. After 1,010 seconds, a darker film than the preceding film was obtained, its characteristics at ±60° being:

$T_L$=16.3% and $T_L$=18.4% or a relative difference of 11%.

EXAMPLE 3

Still with the same NiCr target, a new deposition was carried out still with a clear glass of 4 mm thickness. The conditions were as follows:

gas: Ar (97%)+O₂ (3%)
pressure: 2 hPa
voltage: 556 V
current: 1 A
duration of sputtering: 4,800 seconds.

To find the compatibility of the film with an automobile application, the specimen obtained was laminated by means of an intermediate film of polyvinyl butyryl of 0.76 mm thickness with a glass of 3 mm thickness. The optical evaluation was performed in the present case at an angle of 0° and of ±50°.

The following results were obtained:

| incidence | $T_L$ (%) | $T_E$ (%) |
| --- | --- | --- |
| 0° | 35.4 | 35.0 |
| +50° | 28.0 | 29.0 |
| −50° | 38.0 | 36.0 |

Such a pane, installed in the rear window of an automobile vehicle, permitted, if the window was at an inclination to the horizontal of 40°, for a sun high above the horizon, an energy transmission of only 29%, whereas the driver would have a view to the rear which would rise to 38% (value to be compared with the normal transmission of 35%). In this example, the relative difference of $T_L$ is very high, and reaches 26%.

EXAMPLE 4

Here the target is made of pure chromium. It was used to make two different types of coatings on 4 mm clear glass samples. The first type was a single coating of chromium and the second one a combination of the same coating on which a coating of chromium oxide had been deposited.

The deposition conditions are the same as in Example 1. It is only that the atmosphere, which is pure argon for the metallic coating, whereas it is a mixture of argon and 23% oxygen for the oxide coating. On the other hand during the sputtering of this oxide coating, there is no deflectors channelling the particles on their way between the target and the substrate.

The optical results of both types of deposit are practically identical:

| Incidence | $T_L$ |
| --- | --- |
| 0° | 0.31% |
| +60° | 0.33% |
| −60° | 0.25% |

The relative difference of $T_L$ is hereof 24%.

Comparative abrasion and chemical durability tests were made with both types of deposit.

Abrasion tests are performed with grinding wheels made of abrasive powder held in an elastomer. The machine is produced by Taber Instrument Corporation in the United States. It is model 174 "Standard Abrasion Tester". The grinding wheels are the CS10F loaded with 500 grams.

The test showed that to reach a given transmission increase of the samples it is necessary to grind the sample twice as long in the case of the oxide protective coating compared with the sole metallic layer.

With the chemical durability test, the effect of the protective oxide coating is still better. For this test, the sample is plunged in a bath of HCl.1M at a temperature of 96° C. After 8 hours it is only the pure chromium coating which shows a degradation, i.e., that there are many spots a few square mm large, evenly distributed over the whole surface of the sample. Each spot shows the delamination of the coating. On the other hand with the oxide protected coating there is no degradation at all visible on the sample surface.

This example shows that it is possible to improve the weakness of metallic selective films with oxide coatings.

EXAMPLE 5

In Example 5 the attempt was made to apply the film technique described in European Patent Application EP 0438357, which involves a particularly hard absorbent film which may be used alone, without protection as a deposit on a toughened monolithic pane.

The target is of tantalum. The experimental conditions are as follows:

gas: 100% Ar (100%)

pressure: $2.5 \times 10^{-5}$ hPa voltage: 445 V current: 1 A duration of sputtering: 4,800 seconds.

Such a duration, on the apparatus of FIG. 1, requires 20 passes of the specimen 4 behind the guide 8.

After the operation of depositing the metal film was completed, two passes were made under conditions that differed only by the nature of the gas. In other words, to the argon there was added oxygen in a proportion of 23%. Preliminary tests have shown that this supplementary deposition of an oxidized film did not in practice modify the optical characteristics of the film. On the other hand, the resistance to abrasion is substantially improved.

The light transmission of the above specimen was measured under + and $-60°$ angle of incidence. Two values were obtained, $T_L=30.9$ and $T_L=42.0\%$, which gave a relative difference of 26%.

Thus, the foregoing examples show that the technique of this invention enables absorbent films to be obtained possessing good optical selectivity as a function of the direction of observation.

By comparison with the techniques of the prior art, known and tested in the laboratory, in which a source of small area emitted particles onto a specimen, also of small area, that is to say in which the impact directions were bounded by a slender cone, the technique of this invention as it is carried out in the preceding examples has demonstrated that such a cone is not necessary and that it is sufficient for the directions of impact to lie within a narrow dihedron while having, within this dihedron, all the possible orientations. Surprisingly, in that case, the selectivity is maintained.

This phenomenon, which is surprising because the "columns" of the "columnar" film do not in the present case have one axis as is usual, but an infinity of axes of growth contained within a dihedron of small opening, enables cathodic sputtering—an industrially proved technique—to be used with high efficiency and high speeds of deposition, which would not have been possible if it had been necessary to select one sole direction of impact among all the directions of space. The method is simple and easy to carry out industrially, starting from known conditions for depositing absorbent films. The additional capital costs are not high. With regard to the films, in spite of a less good mechanical performance than that of the isotropic films of the same type, they can easily be improved by the deposition of a protective film. The deposition technique is valid, whatever the dimensions of the plates on which it is performed, and it is therefore well adapted both for plane panes of large dimensions (building panes) and for curved panes for automobiles. In the latter case, when a curved pane moves in front of the guide 8 of FIG. 1, the "plane" of incidence of the particles keeps the same direction, independently of the real orientation of the tangent plane to the pane at the position of the impact (in reality it is a dihedron of angle between $\alpha-\Delta\alpha$ and $\alpha+\Delta\alpha$, because as we have seen the particles are not all in the same plane but are situated within a dihedron of opening $2\Delta\alpha$. In the examples the dihedron is between 5° and 20°, that is to say $\alpha$ is 12.5° and $\Delta\alpha$ is 7.5°). In fact, the plane of incidence of the particles makes the angle $\alpha$ (FIG. 2) with the plane which is termed "the plane of the substrate". (This plane is actually defined in the following manner: it is contained within the pane and parallel both to the axis of the sputtering target and to the direction of travel of the specimen. It is therefore a base plane of the convex surface of the pane. We therefore find on the curved pane defined directions for the optical effects. But, as is desired, the desired optical effects are found on the installed pane with preferential directions with respect to the vehicle (and not with respect to the tangential plane to the pane at each location, as would be the case if the deposition was performed on a plane pane which would be later bent).

In conclusion, the process enables a defined selectivity to be achieved (for example a maximum of transmission in a direction parallel to the axis of the vehicle) even with curved panes. In the case of competing techniques such as holography, such a performance would not be possible unless the hologram of each pane were created individually on the curved pane itself, which would require a very high production costs. In contrast, the deposition of thin films by cathodic sputtering onto curved automobile panes is itself already a well established and well proven industrial technique.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A process for depositing an anisotropic thin film on the surface of a substrate by cathodic sputtering of a target onto the substrate, comprising sputtering a target to produce emitted particles, channelling the emitted particles through a guide to be directed onto the said surface in a direction oblique to the plane of the substrate as defined below, the guide having parallel deflector plates arranged to permit only particles whose directions of impact onto the substrate are parallel to straight lines intersecting the substrate and contained within an acute dihedral angle as viewed from points on the substrate to impact the substrate, the dihedral angle being so oriented that its bisector plane forms with the plane of the substrate an angle less than 40°, the said substrate surface being a planar surface or a convex surface and being geometrically characterized by a plane termed the plane of the substrate which is a plane parallel to said planar surface or is a plane which forms a base plane for said convex surface.

2. The process of claim 1, wherein the dihedral angle is less than 15°.

3. The process of one of claims 1 or 2, wherein the sputtering cathode is a planar magnetron an axis of symmetry of which is substantially parallel to the plane of said substrate and in that the substrate displaces in its own plane.

4. The process of claim 3, wherein said substrate is a curved pane having a convex surface which remains fixed with respect to the plane of the substrate defined as a base plane of the convex surface within the pane which is parallel to vectors in the direction of the said axis of the target and the direction of displacement of the substrate.

5. The process of claim 2, wherein said target is of a nickel-chromium alloy and that said sputtering is performed in an atmosphere consisting essentially of argon.

6. The process of one of claims 1, or 2, wherein said target is selected from the group consisting of tantalum and chromium and in that said sputtering is performed in an argon atmosphere.

7. The process of claim 6, wherein said sputtering is terminated by the addition of oxygen to said argon atmosphere.

8. A structure which is a mechanism for channelling particles emitted by a target of elongate form of a cathodic sputtering cathode onto a substrate moving with respect to it, comprising a cathodic sputtering apparatus and a device comprising an array of mutually parallel plane deflectors, linked to the cathode, and parallel to an axis of symmetry of the cathode which is parallel to the sputtering face of the cathodic sputtering cathode, wherein, the deflectors are associated to form a guide forming a plurality of channels for channelling the emitted particles, in association with the substrate, wherein said plane deflectors make an angle of less than 40° with the plane of the substrate to be coated.

9. A mechanism for channelling particles emitted by a target of elongate form of a cathodic sputtering cathode onto a substrate moving with respect to it, comprising a cathodic sputtering apparatus and a device comprising an array of mutually parallel plane deflectors, linked to the cathode, and parallel to an axis of symmetry of the cathode which is parallel to the sputtering face of the cathodic sputtering cathode, wherein, the deflectors are associated to form a guide forming a plurality of channels for channelling the emitted particles, wherein the geometry of the cathode, the geometry and the position of the deflectors and that of the substrate are such that the directions of impact of the particles remain parallel to straight lines intersecting the substrate and contained within a dihedral angle of less than 15° as viewed from the points in the position of the substrate.

10. The structure of claim 8, wherein the geometry of the cathode, the geometry and the position of the deflectors and that of the substrate are such that the directions of impact of the particles remain parallel to straight lines intersecting the substrate and contained within a dihedral angle of less than 15° as viewed from the points in the position of the substrate.

* * * * *